(12) United States Patent
Tagtow et al.

(10) Patent No.: US 11,021,892 B2
(45) Date of Patent: Jun. 1, 2021

(54) LOCKING SYSTEM HAVING AN ELECTRONIC KEEPER

(71) Applicant: Amesbury Group, Inc., Amesbury, MA (US)

(72) Inventors: Gary E. Tagtow, Sioux Falls, SD (US); Michael Lee Anderson, Sioux Falls, SD (US); Tracy Lammers, Sioux Falls, SD (US); Bruce Hagemeyer, Pella, IA (US); Douglas John Criddle, Sioux Falls, SD (US)

(73) Assignee: Amesbury Group, Inc., Amesbury, MA (US)

( * ) Notice: Subject to any disclaimer, the term of this patent is extended or adjusted under 35 U.S.C. 154(b) by 1192 days.

(21) Appl. No.: 15/239,714

(22) Filed: Aug. 17, 2016

(65) Prior Publication Data

US 2018/0051478 A1 Feb. 22, 2018

(51) Int. Cl.
| | | |
|---|---|---|
| *E05B 15/02* | (2006.01) | |
| *E05B 47/00* | (2006.01) | |
| *H05K 1/14* | (2006.01) | |
| *E05B 47/02* | (2006.01) | |

(52) U.S. Cl.
CPC ...... *E05B 15/0205* (2013.01); *E05B 47/0012* (2013.01); *E05B 47/026* (2013.01); *E05B 2047/0016* (2013.01); *E05B 2047/0023* (2013.01); *E05B 2047/0048* (2013.01); *E05B 2047/0058* (2013.01); *E05B 2047/0069* (2013.01); *E05B 2047/0095* (2013.01); *H05K 1/147* (2013.01); *H05K 2201/10037* (2013.01); *H05K 2201/10151* (2013.01)

(58) Field of Classification Search
None
See application file for complete search history.

(56) References Cited

U.S. PATENT DOCUMENTS

| | | | | |
|---|---|---|---|---|
| 4,420,794 A | * | 12/1983 | Anderson | G07C 9/00944 307/10.5 |
| 4,465,997 A | | 8/1984 | Hines | |
| 4,540,208 A | * | 9/1985 | Logan, Jr. | E05B 65/1066 292/201 |
| 4,595,220 A | | 6/1986 | Hanchett, Jr. | |

(Continued)

FOREIGN PATENT DOCUMENTS

| | | |
|---|---|---|
| CA | 2645471 A1 | 5/2009 |
| CA | 2631521 A1 | 11/2009 |

(Continued)

OTHER PUBLICATIONS

PCT Invitation to Pay Additional Fees in PCT Application PCT/US2017/047348, dated Nov. 15, 2017, 12 pages.

(Continued)

*Primary Examiner* — Alyson M Merlino

(57) ABSTRACT

An apparatus has a housing with an elongate axis partially defining an interior chamber. A face plate is connected to the housing and defines a deadbolt opening. A circuit board disposed within the interior chamber has a first portion and second portion communicatively connected via a flexible ribbon. A battery holder is connected to the first portion. A sensor is connected to the second portion and is disposed proximate the deadbolt opening.

14 Claims, 15 Drawing Sheets

(56) References Cited

U.S. PATENT DOCUMENTS

| | | | |
|---|---|---|---|
| 4,616,865 A * | 10/1986 | Mackle | E05B 47/0047 292/341.16 |
| 4,683,741 A * | 8/1987 | Fields | E05B 17/10 109/38 |
| 4,717,909 A * | 1/1988 | Davis | G08B 21/22 200/61.68 |
| 5,257,841 A | 11/1993 | Geringer | |
| 5,735,559 A | 4/1998 | Frolov | |
| 5,757,269 A | 5/1998 | Roth | |
| 5,825,288 A | 10/1998 | Wojdan | |
| 5,946,956 A | 9/1999 | Hotzl | |
| 5,987,818 A * | 11/1999 | Dabideen | E05B 47/026 292/144 |
| 6,035,676 A * | 3/2000 | Hudspeth | E05B 47/026 292/144 |
| 6,098,433 A | 8/2000 | Maniaci | |
| 6,381,999 B1 * | 5/2002 | Doong | E05B 47/0012 292/144 |
| 6,441,735 B1 | 8/2002 | Marko | |
| 6,568,726 B1 | 5/2003 | Caspi | |
| 6,570,498 B1 * | 5/2003 | Frost | G07C 9/00103 340/5.2 |
| 6,580,355 B1 * | 6/2003 | Milo | E05B 47/0012 340/5.7 |
| 6,619,085 B1 * | 9/2003 | Hsieh | E05B 47/0012 292/144 |
| 6,644,072 B1 * | 11/2003 | Hsieh | E05B 47/0002 70/107 |
| 6,658,905 B1 * | 12/2003 | Hsieh | E05B 47/0012 70/107 |
| 6,666,054 B1 * | 12/2003 | Hsieh | E05B 47/0012 292/144 |
| 6,845,641 B2 * | 1/2005 | Hsieh | E05B 47/0012 70/150 |
| 7,010,947 B2 | 3/2006 | Milo | |
| 7,032,418 B2 | 4/2006 | Martin | |
| 7,128,350 B2 | 10/2006 | Eckerdt | |
| 7,158,029 B1 | 1/2007 | Martyn | |
| 7,388,742 B2 * | 6/2008 | Cargin, Jr. | G06F 1/1613 361/679.01 |
| 7,690,230 B2 * | 4/2010 | Gray | E05B 47/00 361/759 |
| 8,269,627 B2 | 9/2012 | Gore et al. | |
| 8,325,039 B2 | 12/2012 | Picard | |
| 8,403,376 B2 | 3/2013 | Greiner | |
| 8,624,736 B2 | 1/2014 | Gore et al. | |
| 8,646,816 B2 | 2/2014 | Dziurdzia | |
| 8,851,532 B2 | 10/2014 | Geringer | |
| 8,922,370 B2 | 12/2014 | Picard | |
| 9,157,902 B2 | 10/2015 | Gore et al. | |
| 9,245,439 B2 | 1/2016 | Lamb et al. | |
| 9,933,243 B2 | 4/2018 | Thibault et al. | |
| 9,959,745 B2 | 5/2018 | Lamb et al. | |
| 10,228,266 B1 | 3/2019 | McGruder et al. | |
| 10,234,307 B1 | 3/2019 | McGruder et al. | |
| 2004/0011094 A1 * | 1/2004 | Hsieh | E05B 47/026 70/57 |
| 2004/0089037 A1 | 5/2004 | Chang | |
| 2004/0112100 A1 | 6/2004 | Martin | |
| 2004/0159134 A1 * | 8/2004 | Eichenauer | E05B 47/0046 70/278.1 |
| 2005/0044908 A1 | 3/2005 | Min | |
| 2005/0231365 A1 * | 10/2005 | Tester | G06K 19/07798 340/568.1 |
| 2007/0081309 A1 * | 4/2007 | Urushibara | H05K 1/147 361/748 |
| 2008/0000276 A1 | 1/2008 | Huang | |
| 2008/0127686 A1 * | 6/2008 | Hwang | E05B 47/0012 70/107 |
| 2008/0174951 A1 * | 7/2008 | Mundt | G06F 1/1616 361/679.41 |
| 2008/0191499 A1 | 8/2008 | Stein | |
| 2009/0218832 A1 | 9/2009 | Mackle | |
| 2009/0315669 A1 | 12/2009 | Lang | |
| 2010/0313612 A1 | 12/2010 | Eichenstein | |
| 2011/0015789 A1 | 1/2011 | LaJeunesse | |
| 2013/0340491 A1 * | 12/2013 | Lambrou | E05B 47/0012 70/277 |
| 2014/0062466 A1 | 3/2014 | Thibault et al. | |
| 2014/0182343 A1 | 7/2014 | Talpe | |
| 2014/0367978 A1 | 12/2014 | Geringer | |
| 2015/0089804 A1 | 4/2015 | Picard | |
| 2015/0170449 A1 | 6/2015 | Chandler, Jr. | |
| 2015/0176311 A1 | 6/2015 | Picard | |
| 2015/0267442 A1 * | 9/2015 | Zhang | E05B 47/026 292/139 |
| 2016/0372811 A1 * | 12/2016 | Yosui | H05K 1/18 |
| 2017/0234033 A1 | 8/2017 | DeBoer et al. | |
| 2018/0155959 A1 | 6/2018 | Hartung et al. | |
| 2019/0122530 A1 | 4/2019 | Lamb et al. | |

FOREIGN PATENT DOCUMENTS

| | | | |
|---|---|---|---|
| CA | 2645471 C | 10/2016 | |
| DE | 19500054 C1 * | 7/1996 | E05B 45/083 |
| EP | 2450509 A2 | 5/2012 | |
| FR | 2848593 B1 | 2/2005 | |
| JP | 64-083777 A | 3/1989 | |
| JP | 2006112042 A | 4/2006 | |
| JP | 2008002203 A | 1/2008 | |
| KR | 2011094706 A | 8/2011 | |
| WO | 2015/079290 A1 | 6/2015 | |

OTHER PUBLICATIONS doorking.com—Electric Locks—Strikes and Deadbolts; printed from https://www.doorking.com/access-control/electric-locks-strikes-deadbolts, 2 pages, Feb. 2016.

magneticlocks.net—Electric Strikes and Deadbolts; printed from https://www.magneticlocks.net/electric-strikes-and-deadbolts/electric-strikes.html, 8 pages, Feb. 2016.

sdcsecurity.com—Latch and Deadbolt Monitoring Strikes; printed from http://www.sdcsecurity.com/monitor-strike-kits2.htm, 2 pages, Feb. 2016.

PCT International Search Report and Written Opinion in International Application PCT/US2017/047348, dated Jan. 15, 2018, 19 pages.

* cited by examiner

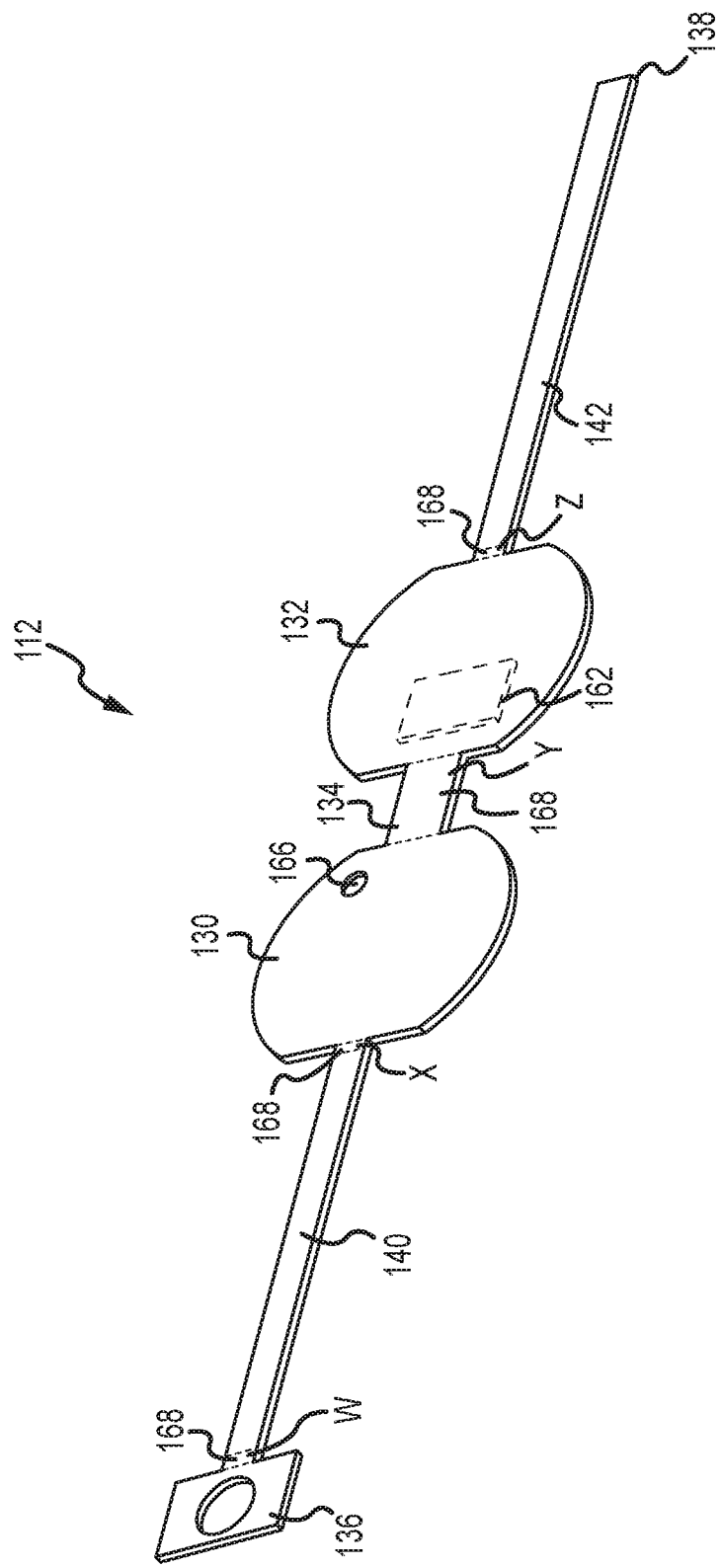

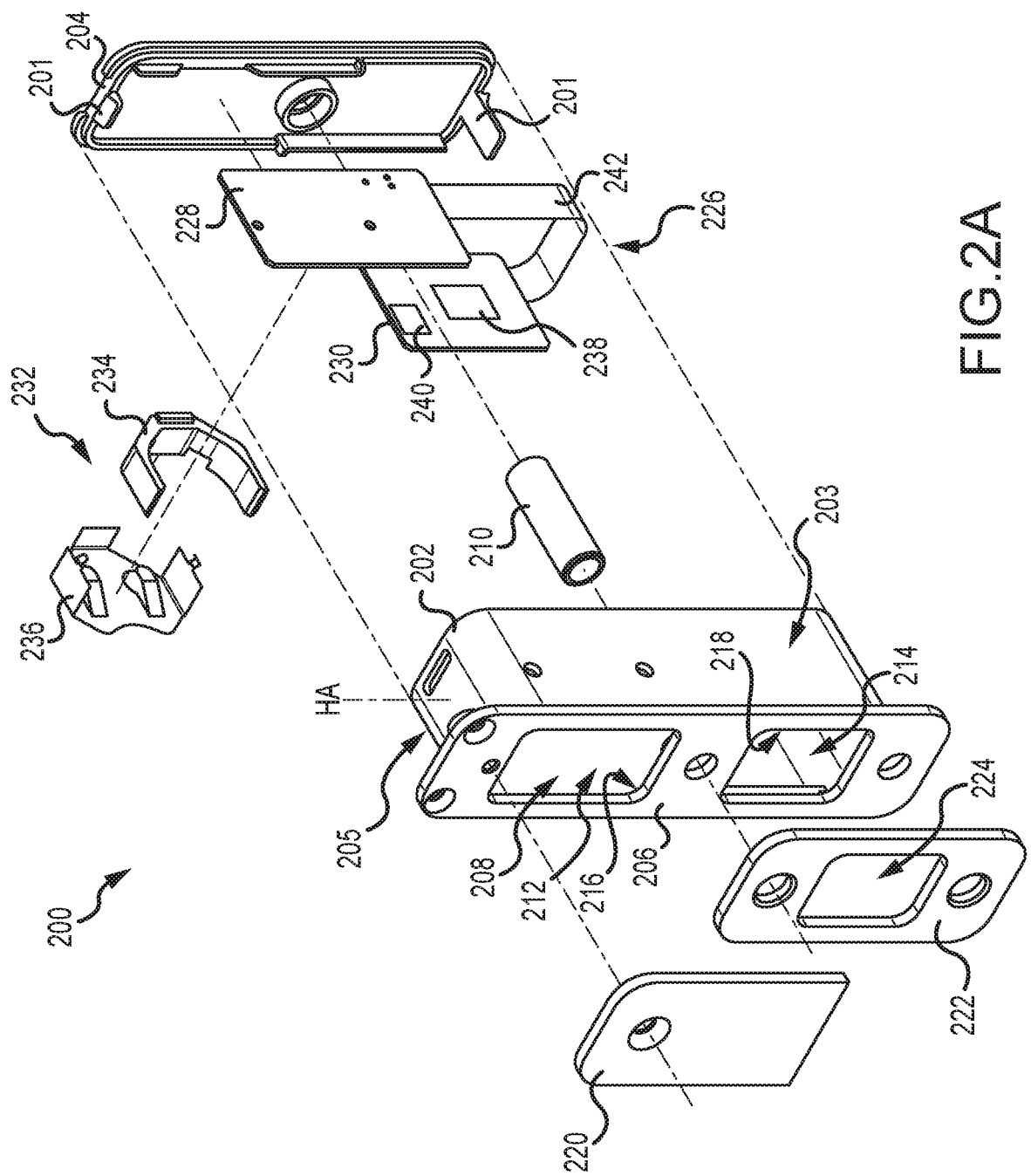

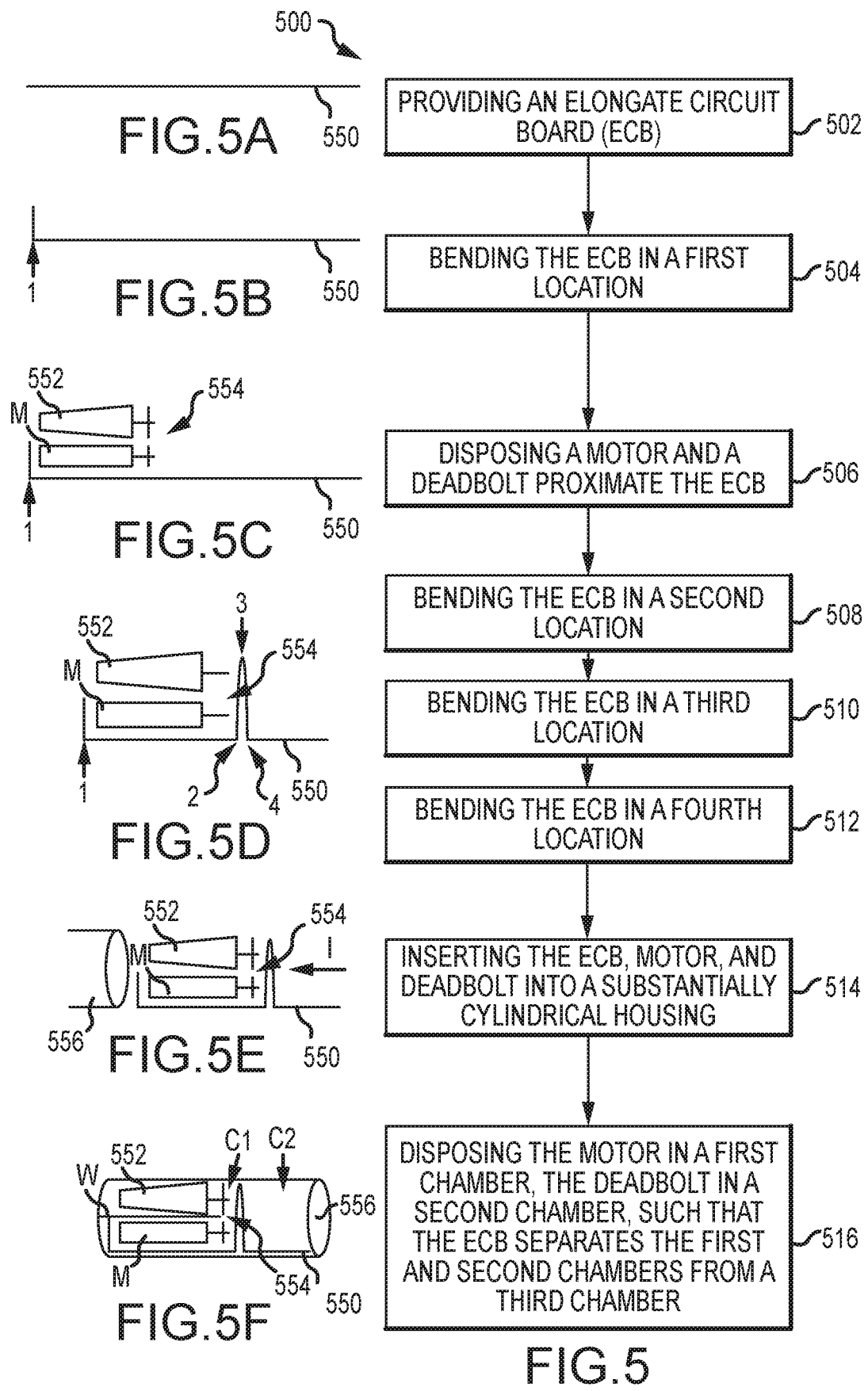

LOCKING SYSTEM HAVING AN ELECTRONIC KEEPER

INTRODUCTION

Deadbolts are operated by a user (e.g., with a key on an outside of the door or a thumbturn on the inside of the door) to secure the door against unwanted intrusions. Motorized deadbolts are also available, but these can display disadvantages. For example, it can often be difficult to determine whether the door is actually locked without attempting to open the door. This can cause the door to be breached if the user believes it to be locked when that is, in fact, not so.

SUMMARY

In one aspect, the technology relates to an apparatus having: a housing having an elongate axis and at least partially defining an interior chamber; a face plate connected to the housing, wherein the face plate defines a deadbolt opening; a circuit board disposed within the interior chamber, wherein the circuit board includes a first portion and a second portion communicatively connected via a flexible ribbon; a battery holder connected to the first portion; and a sensor connected to the second portion and disposed proximate the deadbolt opening. In an embodiment, the apparatus further includes a battery door connected to at least one of the housing and the face plate, wherein the first portion is disposed proximate the battery door. In another embodiment, the first portion is disposed on a first side of the elongate axis and the second circuit board is disposed on a second side of the elongate axis, such that the flexible ribbon is formed into an approximate U-shaped configuration. In yet another embodiment, the first portion is disposed on a first side of the elongate axis and the second portion is disposed on the first side of the elongate axis, such that the flexible ribbon is formed into a folded configuration. In still another embodiment, the first portion is disposed on a first side of the elongate axis and the second portion is disposed substantially orthogonal to the elongate axis, such that the flexible ribbon is formed into an L-shaped configuration.

In another embodiment of the above aspect, the sensor includes at least one of an RFID sensor, a proximity sensor, a pressure sensor, and a magnet sensor. In an embodiment, the sensor is disposed substantially parallel to a path of travel defined by the deadbolt opening. In another embodiment, the sensor projects into the path of travel defined by the deadbolt opening.

In another aspect, the technology relates to an apparatus having: a housing having a face plate, wherein the face plate defines a first opening and a second opening; a first circuit board portion disposed in the housing proximate the first opening; a second circuit board portion disposed in the housing proximate the second opening; and a flexible ribbon connecting the first circuit board portion and the second circuit board portion. In an embodiment, the housing includes a first sidewall and a second sidewall, wherein the face plate spans from the first sidewall to the second sidewall. In another embodiment, the first circuit board is disposed proximate the first sidewall and the second circuit board portion is disposed proximate the second sidewall. In yet another embodiment, the first circuit board portion and the second circuit board portion are disposed proximate the first sidewall. In still another embodiment, the first circuit board portion is disposed proximate the first sidewall and the second circuit board portion is disposed orthogonal to both the first sidewall and the second sidewall.

In another embodiment of the above aspect, the apparatus further includes: a battery holder secured to the first circuit board portion; and a sensor secured to the second circuit board portion. In an embodiment, the apparatus further includes a battery boor removably secured over the first opening. In another embodiment, the sensor has at least one of an RFID sensor, a proximity sensor, a pressure sensor, and a magnet sensor. In yet another embodiment, the apparatus further includes a communication element secured to at least one of the first circuit board portion and the second circuit board portion.

In another aspect, the technology relates to a method of manufacturing a keeper for a door, the method including: inserting into a housing a first portion of a circuit board; forming at least one of a bend and a fold in a flexible ribbon extending from the first portion of the circuit board; and inserting into the housing a second portion of the circuit board connected to the flexible ribbon at an end opposite the first portion of the circuit board. In an embodiment, the method further includes: prior to the forming operation, selecting the housing from a plurality of housings, wherein each of the plurality of housings has a length dimension distinct from that of another housing of the plurality of housings. In another embodiment, the flexible ribbon has a ribbon length regardless of the length dimension of the selected housing.

BRIEF DESCRIPTION OF THE DRAWINGS

There are shown in the drawings, examples which are presently preferred, it being understood, however, that the technology is not limited to the precise arrangements and instrumentalities shown.

FIG. 1C is a perspective view of a circuit board for an electronic deadbolt system.

FIGS. 2A and 2B are exploded perspective and partial perspective views, respectively, of an electronic keeper in accordance with one example of the technology.

FIG. 5 depicts a method of manufacturing an electronic deadbolt.

FIGS. 5A-5F depict schematic side views of components of the electronic deadbolt system at various stages of manufacture.

DETAILED DESCRIPTION

Figure 1A:
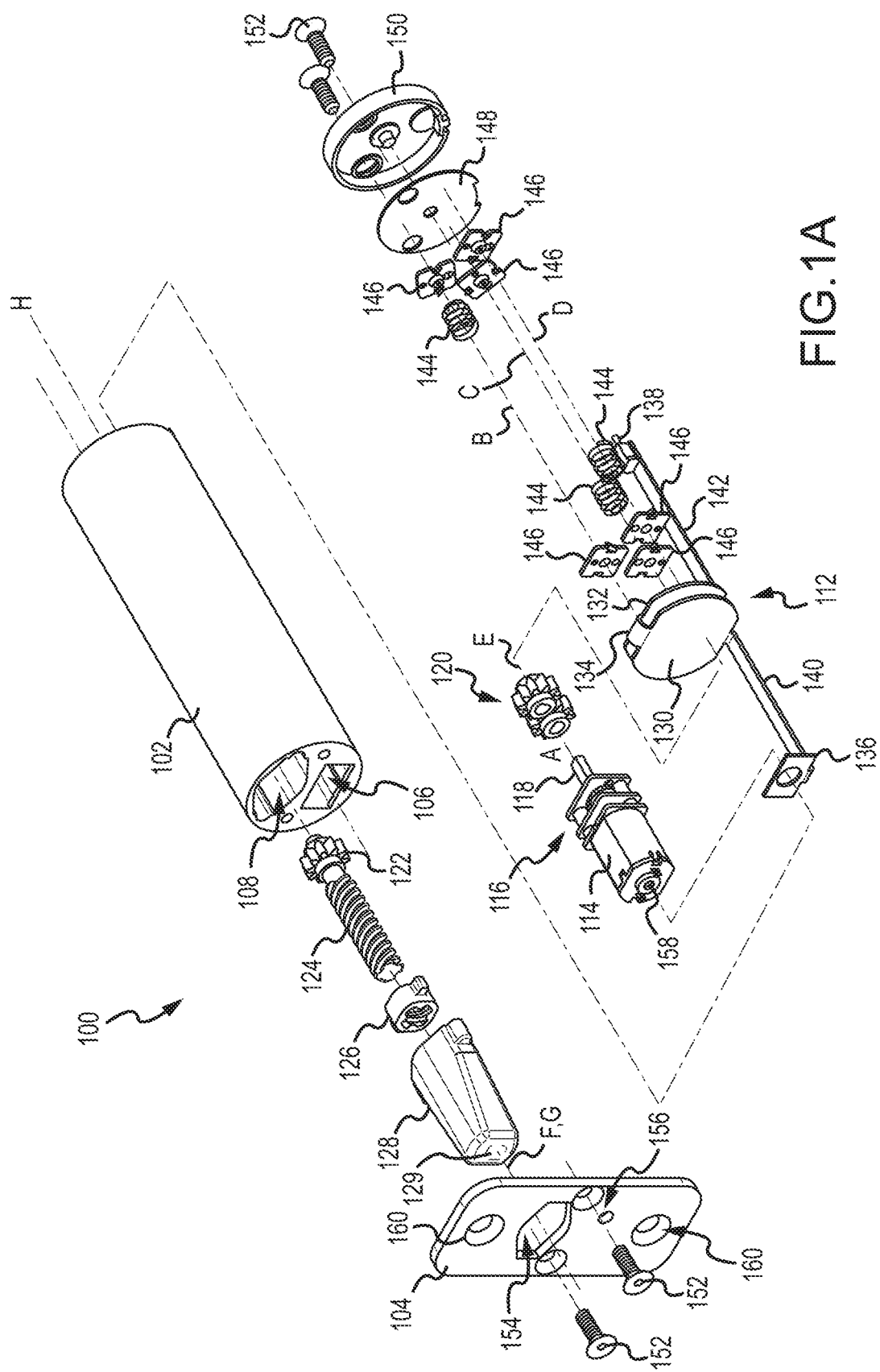
FIGS. 1A and 1B are exploded perspective and partial perspective views, respectively, of an electronic deadbolt system.
Figure 1B:
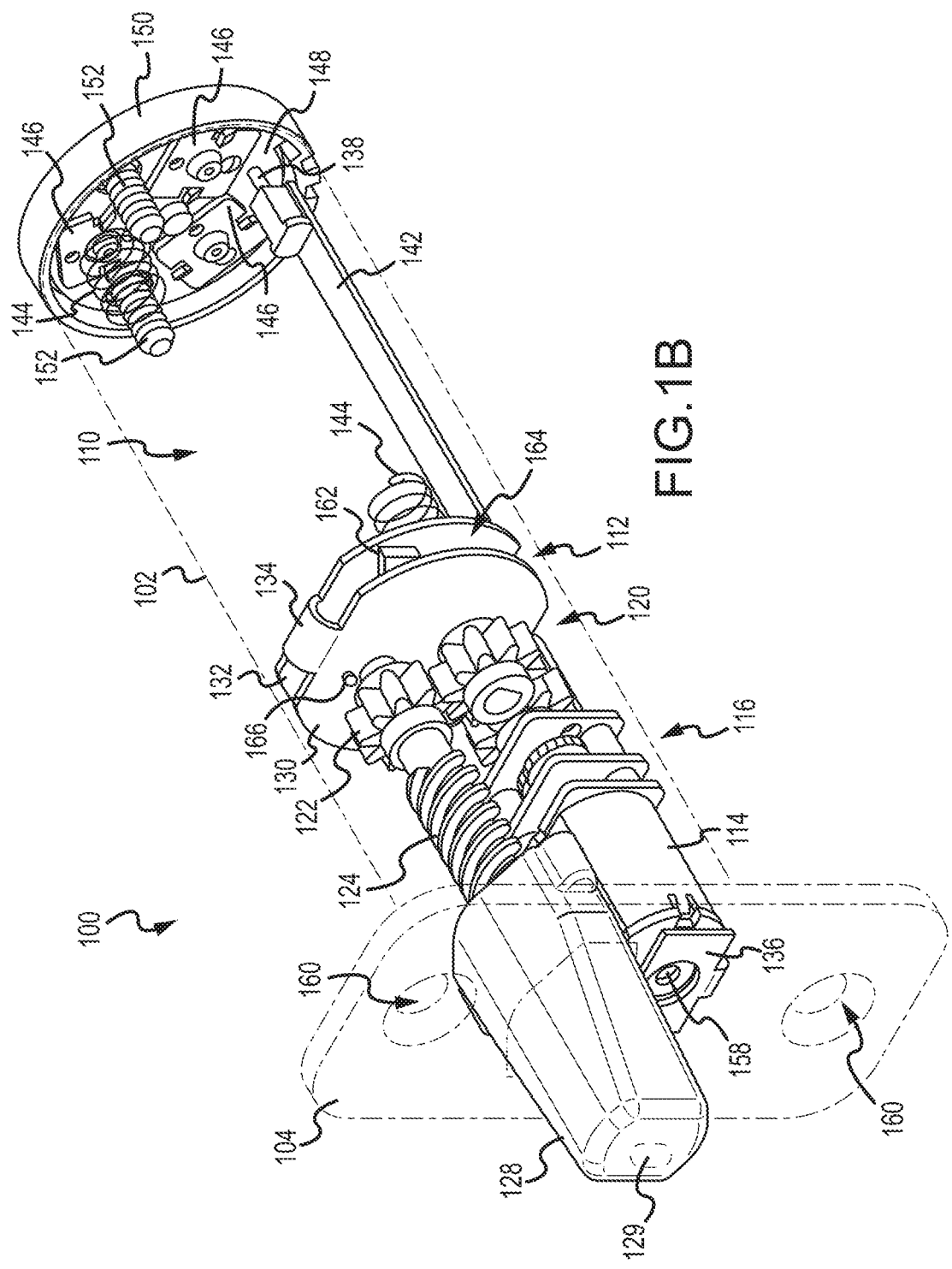

FIGS. 1A and 1B are exploded perspective and partial perspective views, respectively, of an electronic deadbolt system 100 and are described concurrently. In FIG. 1B, certain components, e.g., a housing 102 and a face plate 104, are depicted in dashed lines to depict more clearly the assembled components contained within the deadbolt system 100. The housing 102 defines a motor chamber 106, a deadbolt chamber 108, and a battery chamber 110. The motor chamber 106 and the deadbolt chamber 108 may be combined into a single chamber, if required or desired. Internal structures within the housing 102 that separate the motor chamber 106 from the deadbolt chamber 108 are not depicted in FIG. 1B. The motor chamber 106 and the deadbolt chamber 108 are separated from the battery chamber 110 by portions of a circuit board 112, as described in more detail below. The motor chamber 106 is configured to receive a motor 114 that includes a motor shaft having an axis that is coaxial with drive system axis A. The motor 114 may be an off-the-shelf unit that includes an integral gear set 116. This gear set 116 may have a drive axis 118 that drives an additional transfer gear set 120, which includes a lead screw drive gear 122 that is disposed in the deadbolt chamber 108. As such, the transfer gear set 120 spans from the motor chamber 106 to the deadbolt chamber 108. In another example, the integral gear set 116 need not be utilized, and the motor shaft may directly drive a gear set such as transfer gear set 120. The lead screw drive gear 122 drives a lead screw 124 that includes a nut 126 that connects the lead screw 124 to a deadbolt 128, such that rotation of the lead screw 124 translates into linear movement of the deadbolt 128. Thus, rotation of the lead screw 124 can extend and retract the deadbolt 128 from the housing 102. The deadbolt 128 may include, on an outer surface thereof, or embedded therein, an RFID chip 129, the function of which is described in further detail below.

The circuit board 112 includes a number of portions that allow it to be fitted into the housing 102 so as to conserve internal space thereof. For example, the circuit board 112 includes a first portion 130 and a second portion 132 connected by a flexible substrate portion or live hinge 134. These first 130 and second portions 132 are disposed between the battery chamber 110 and the motor and deadbolt chambers 106, 108. The circuit board 112 further includes a motor contact 136 and a battery contact 138, each of which are connected to one of the first and second portions 130, 132 via a lead ribbon 140, 142 of board substrate which may be flexible or rigid. The lead ribbons 140, 142 allow the motor and battery contacts 136, 138 to extend to the opposite ends of their respective chambers 106, 110. The battery chamber 110 includes a number of discrete battery contacts in the form of springs 144 and contact plates 146, as known in the art. In the depicted example, springs 144 and contact plates 146 for three "AA" batteries are depicted, although other battery types, arrangements, and power sources may be utilized. A contact plate 148 is disposed at an end of the battery chamber 110 and is configured to contact the battery contact 138 so as to form a complete power circuit therebetween.

An end plate 150 may be secured to the end of the housing 102 with one or more screws 152 to secure the battery chamber 110. Although not depicted, one or more electrical wires may exit the housing 102, e.g., proximate the end plate 150, so as to allow the deadbolt system 100 to be powered, alternatively or additionally, by a remote power source, such as building power, a remote battery, or other source. Control wiring to a remote controller may also be present. These wires may be connected at or near the battery contact 138. At an opposite end of the housing 102, the faceplate 104 may be secured with one or more screws 152. The faceplate 104 defines a deadbolt opening 154 for allowing passage of the deadbolt 128 and an LED opening 156 to allow a user to view an LED 158 disposed on the end of the motor 114, which may be indicative of status condition, lock condition, battery power condition, or other conditions. Further, the faceplate 104 may define one or more openings 160 configured to receive screws 152 to secure the deadbolt system 100 to a door panel.

The deadbolt system 100 depicted in FIGS. 1A and 1B is constructed and configured in a manner that reduces overall space, eases installation (even by untrained purchasers), and limits end-user access to critical internal components. With regard to reducing space, the elongate elements of the deadbolt are configured so as to have parallel axes (e.g., rotational axes). For example, drive system axis A is parallel to the axes of each battery (depicted as axes B, C, D in FIG. 1A). The batteries are not depicted, but their axes are defined by the positive and negative poles disposed along the identified lines B, C, and D. These axes are also parallel to the axes of each gear of the transfer gear set 120. A single axis E is depicted in FIG. 1A, although each gear of the gear set 120 has its own axis. Other parallel axes include axes F and G, which are associated with the lead screw 124 and the deadbolt 128, respectively, and are also coaxial. All of the above-identified axes are also parallel to the axis H of the housing 102. By arranging these elongate elements such that the axes A-H are parallel, circumference of the housing 102 may be reduced, which reduces overall size of the deadbolt system 100 and the space that it occupies.

Overall size of the deadbolt system 100 is further reduced by disposing the first and second portions 130, 132 of the circuit board 112 parallel to each other, and between the battery chamber 110 and the combined location of the motor chamber 106 and the deadbolt chamber 108. This configuration provides for a significant available area on the circuit board 112 to be located within the housing 102. Additionally, the location of the circuit board 112, substantially orthogonal to the axes A-H, prevents end-user access to the motor chamber 106 and the deadbolt chamber 108. Instead, the end-user would only have access to the battery chamber 110, e.g., via the end cap 150, to replace the batteries therein. This prevents potential end-user tampering with movable components of the deadbolt system 100, which might void the warranty, cause damage, or allow for debris infiltration into those internal volumes. Further space within the housing 102 is saved by disposing the ribbons 140, 142 so as to be substantially parallel to the axes A-H.

In examples, the housing 102 may be cylindrical with a maximum diameter of about one inch, one and one-quarter inch, or one and one-half inch or more. Such small diameters are possible because the largest linear dimension of each of chambers 106, 108, 110 are substantially aligned with the housing axis H. Such diameters allow the use of readily-available drill bits to drill a door panel so as to install the deadbolt system 100. Thus, this simplifies installation, even by inexperienced end-users. As such, the deadbolt system 100 (and one or more of the keepers described below) may be sold as a kit containing a deadbolt and keeper, as required or desired for a particular application, to be installed by an end-user (e.g., a homeowner).

FIG. 1B depicts the deadbolt system 100 with the housing 102 depicted transparent for clarity. This figure is used to describe further aspects of the circuit board 112 and other internal components related thereto. The circuit board 112 is a substrate on which is mounted a number of components utilized to control the deadbolt system 100. For example, the circuit board 112 may include a communication module 162, e.g., disposed on the second portion 132 thereof. By locating the communication module 162 or other components in a void 164 defined by the two parallel first and second portions 130, 132 of the circuit board 112, these modules and elements may be protected from damage or tampering. On the first portion 130, a sensor 166 is disposed so as to detect a rotational condition or position of the lead screw drive gear 122 (and therefore, ultimately, a position of the deadbolt 128). As the lead screw drive gear 122 rotates, the sensor 166 detects this rotation and sends a signal to a processor (not shown). This signal may be used in a number of ways, for example, to confirm that the deadbolt is extended, detect an operational condition in the deadbolt system 100, such as a failure of complete deadbolt 128 extension, or other purposes as required or desired for a particular application.

FIG. 1C is a perspective view of a circuit board 112 for an electronic deadbolt system, such as that depicted in FIGS. 1A and 1B. Certain components are described above with regard to FIGS. 1A and 1B and are not necessarily described further. The circuit board 112 may be a substantially rigid substrate on which conductive tracks or leads are formed by known processes (e.g., etching). In other examples, the circuit board 112 may be manufactured from a flexible substrate. If a rigid substrate is used, the thickness of the substrate may be reduced in areas 168 bounded by dotted lines. By reducing the thickness of these areas 168, the substrate may be bent, folded, or otherwise manipulated so as to be formed into the configuration depicted in FIGS. 1A and 1B. In another example, these areas 168 may be manufactured of a flexible ribbon such as that described below, and connected to contacts 136, 138, and portions 130, 132. The leads formed on the substrate for signal transmission may be formed on the portions of the substrate that are not removed. After the thicknesses of areas 168 are reduced, the circuit board 112 may be inserted into the housing 102 in a specific operation and orientation, for example, the operation depicted in FIGS. 5-5F. In sum, this operation includes folding portions W and X into the configuration depicted in FIGS. 1A and 1B. The motor 144, the transfer gear set 120, the lead screw 124, the deadbolt 128, and related components are disposed between the motor contact 136 and first portion 130. This combination of elements is then inserted axially into the housing 102 and secured therein as required or desired. Prior to insertion, portions Y and Z may also be folded so as to be easily inserted along with the above combination of elements. This simplifies the manufacturing process.

The deadbolt system 100 may be utilized with standard keepers (typically disposed in the door frame opposite the door panel when closed), or may be used with an electronic keeper that may detect the extension of the deadbolt 128. These electronic keepers may be one of the keepers described in the following figures. Alternatively, one of the following keepers may be used with a particular type of deadbolt system that need not necessarily be electronic. That is, an electronic keeper may be utilized with a manual deadbolt. Various examples of electronic keepers are described below.

Figure 2B:
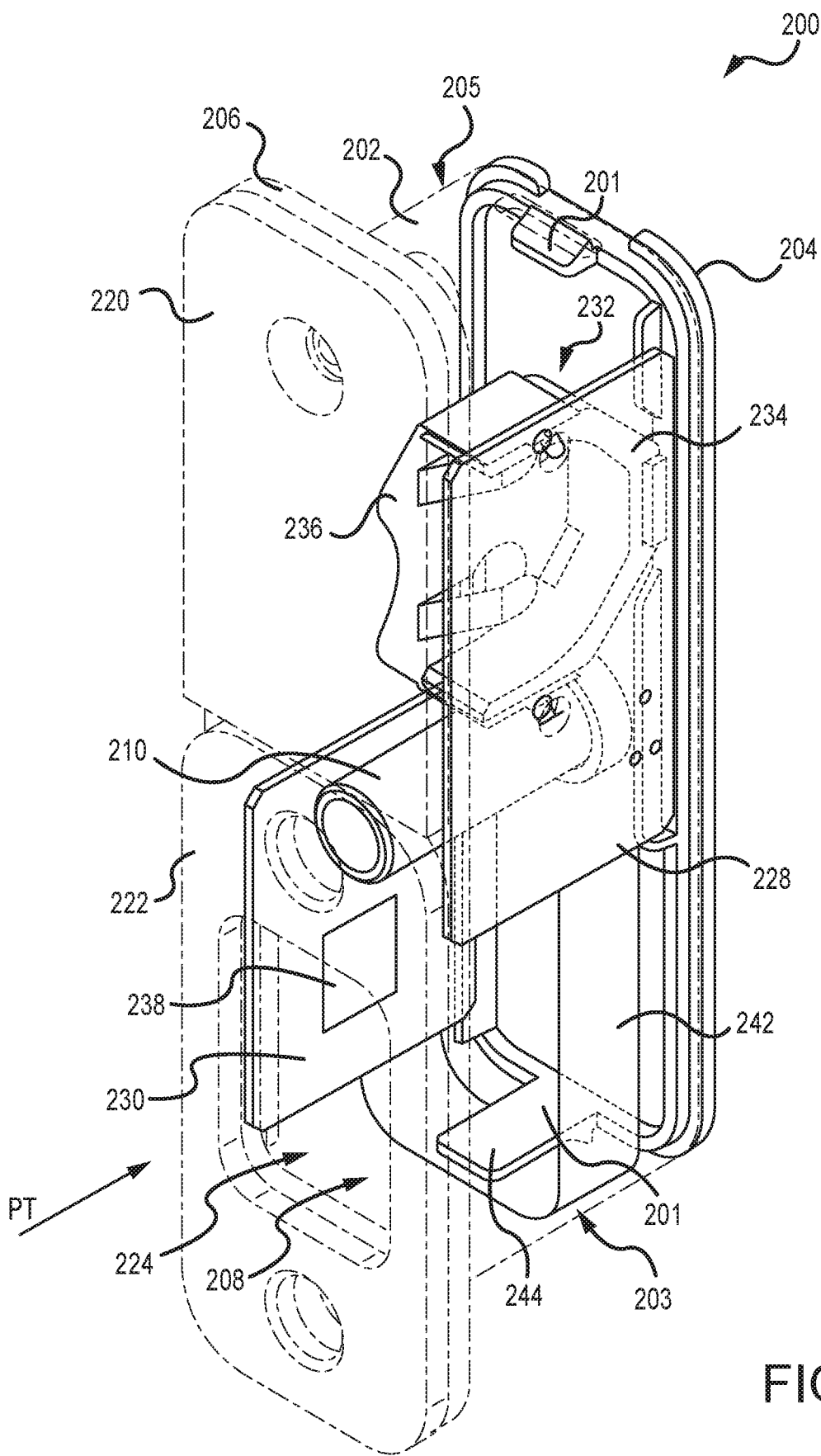

FIGS. 2A and 2B are exploded perspective and partial perspective views, respectively, of an electronic keeper 200 in accordance with one example of the technology, and are described concurrently. In FIG. 2B, an outer housing of the keeper is depicted in dashed lines so as to show the internal components thereof. This example of an electronic keeper 200 may be utilized on an entry door, for example, with the electronic deadbolt system 100 depicted in FIGS. 1A-1B, or with a manually-operated deadbolt, as known in the art. The keeper 200 includes a housing 202 and a rear wall 204 that may be snap-fit or press-fit onto the housing 202 with tabs 201. In another example, the rear wall 204 may be secured to the housing 202 with mechanical fasteners or adhesives, or may be integral with the housing 202. A face plate 206 is connected to a side of the housing 202 opposite the rear wall 204 spanning from first 203 to second 205 sidewalls thereof. Thus, combined, the housing 202, rear wall 204, and faceplate 206 define an interior chamber 208 in which a number of other components are disposed, as described below. A post 210 or other support strut may span the interior chamber 208 from the rear wall 204 to the faceplate 206 and may act as a guide for a screw or other fastener (not shown) to secure the faceplate 206 and rear wall 204 to the housing 202. In the depicted keeper 200, the post 210 separates the interior chamber 208 into a battery chamber 212 above and a deadbolt-receiver chamber 214 below, although the post 210 need not completely isolate the chambers 212, 214 from each other. Additionally, the post 210 need not be utilized. The housing 202 also defines an elongate housing axis HA extending vertically through the interior chamber 208. The faceplate 206 defines a plurality of openings, specifically, a battery opening 216 disposed proximate the battery chamber 212 and a deadbolt-receiver opening 218 disposed proximate the deadbolt-receiver chamber 214. A cover plate 220 or battery door may be disposed so as to cover the battery opening 216, while a decorative plate 222 defining an opening 224 may frame the deadbolt-receiver opening 218.

A circuit board 226 is disposed within the interior chamber 208. The circuit board includes two sections or portions 228, 230 that are secured, e.g., to first 203 and second 205 sidewalls, respectively, of the housing 202. The first section 228 provides a mounting location for operational modules and components. For example, a battery holder 232 having a cradle 234 and cover 236 may be secured to the first portion 228. Thus, once installed, the battery holder 232 may be accessed by removing the cover plate 220 and removing/installing a battery, as required. The second section 230 provides a mounting location for other operational modules and components. For example, an RFID sensor 238 may be present, as may a communication module 240. Both components may be located so as to be substantially parallel to a path of travel PT of a deadbolt as it enters the opening 224. The RFID sensor 238 may be used to detect an RFID chip, for example, the chip installed in or on the deadbolt depicted in FIGS. 1A and 1B, when that deadbolt is disposed in the interior chamber 208. As such, when the RFID sensor 238 detects the RFID chip, the electronic keeper 200 may communicate this condition to the electronic deadbolt or to a remote application or system, e.g., via the communication module 240 or even a wired connection. Although an RFID sensor is depicted, other types of sensors, such as proximity sensors, magnetic sensors, or mechanical sensors such as pressure or contact sensors, may be utilized. Contact sensors may project into the path of travel PT.

The two sections or portions 228, 230 of the circuit board 226 are communicatively coupled via a flexible ribbon 242. The flexible ribbon 242 may be formed as described above for the circuit board 226 utilized in the electronic deadbolt of FIGS. 1A and 1B. That is, the substrate forming the circuit board 226 may be manufactured thinner in portions that will be bent or folded, or those portions may be reduced in thickness subsequent to manufacture. In another example, the flexible ribbon 242 may be manufactured of a material different than the first and second sections 228, 230, for example, flexible plastic substrates such as polyimide, PEEK, or transparent conductive polyester film. Additionally or alternatively, the flexible ribbon may be screen printed silver circuits on polyester. In another example, the entire circuit board 226 may be manufactured of a flexible substrate. In this depicted example of the electronic keeper 200, the first section 228 is disposed on a first side of the housing axis HA and in the battery chamber 212, while the second section 230 is disposed on an opposite side of the housing axis HA and in the deadbolt-receiving chamber 214. Moreover, FIG. 2B depicts that at least one of the tabs 201 may include an elongate portion 244 to help retain the flexible ribbon 242 against the housing 202, so as to prevent damage thereto, e.g., by contact with a deadbolt.

Figure 2C:
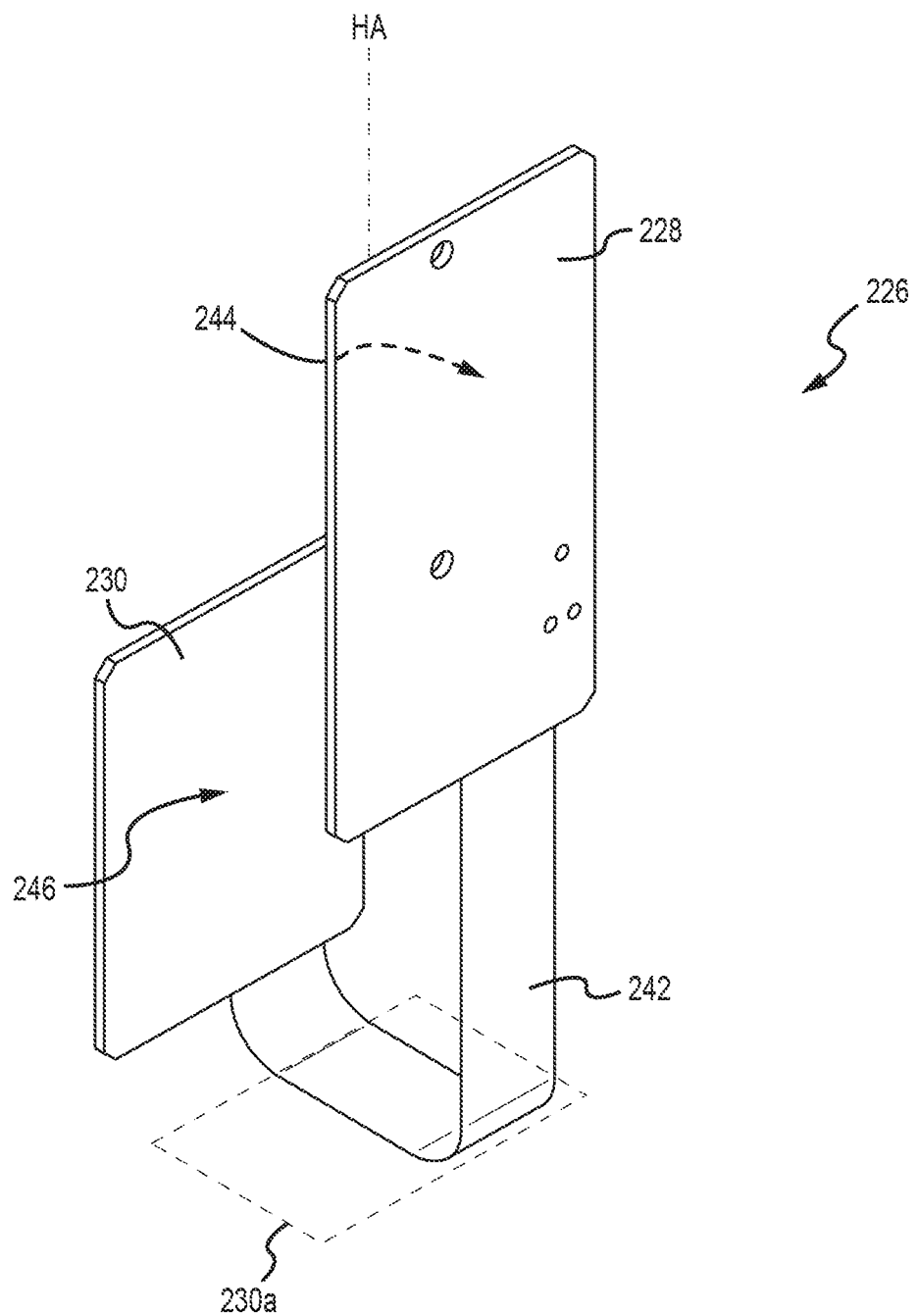
FIG. 2C is a perspective view of a circuit board for the electronic keeper of FIGS. 2A and 2B.

FIG. 2C is a perspective view of the circuit board 226 for the electronic keeper of FIGS. 2A and 2B. The particular configuration allows the circuit board 226 to be used across a wide variety of keeper configurations, thereby reducing manufacturing costs and factory storage requirements for components prior to manufacture. For example, the circuit board 226 is formed such that the modules and other components are disposed on a single side of the circuit board 226 when that circuit board 226 is in a flat configuration. That is, such components may be installed on a component face 244 of the first section 228 and a component face 246 of the second section 230, such that, when the flexible ribbon 242 is deformed (e.g., folded or bent) into the U-shaped configuration depicted in FIG. 2C, the component faces 244, 246 are facing towards the housing axis HA, and generally towards each other. In another example, the flexible ribbon 242 may be folded such that the section 230a is positioned substantially orthogonal to the elongate axis HA. In such a configuration, the ribbon 242 has an L-shape.

Figure 3A:
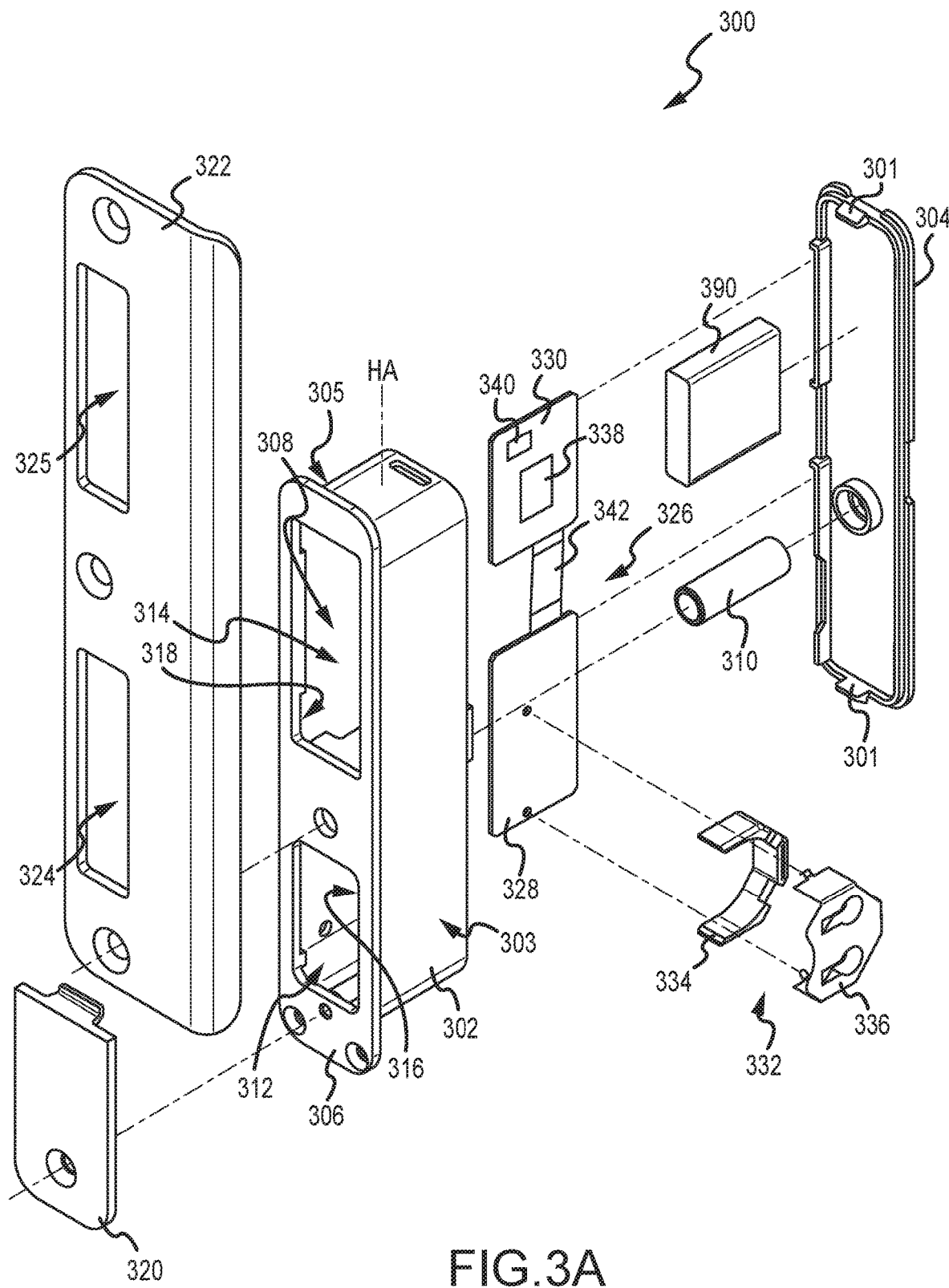
FIGS. 3A and 3B are exploded perspective and partial perspective views, respectively, of an electronic keeper in accordance with another example of the technology.
Figure 3B:
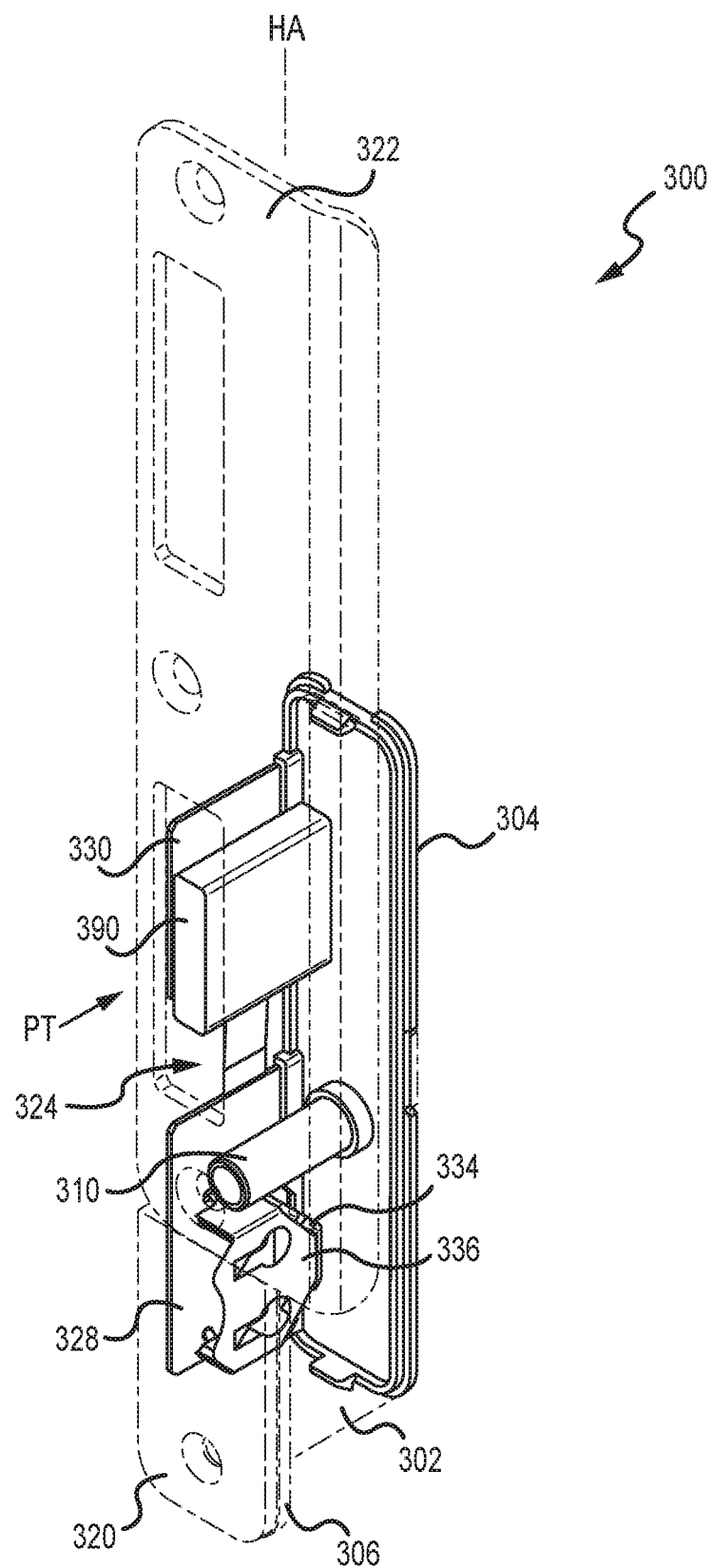

FIGS. 3A and 3B are exploded perspective and partial perspective views, respectively, of an electronic keeper 300 in accordance with another example of the technology. In FIG. 3B, an outer housing of the keeper is depicted in dashed lines so as to show the internal components thereof. This example of an electronic keeper 300 may be utilized with, for example, on a swinging patio door. Locks utilized on such a door include the P3000 lock from Amesbury Truth of Sioux Falls, S. Dak. The P3000 includes a manually-operated deadbolt as well as a spring-loaded latch. The keeper 300 includes a housing 302 and a rear wall 304 that may be snap-fit or press-fit onto the housing 302 with tabs 301. In another example, the rear wall 304 may be secured to the housing 302 with mechanical fasteners or adhesives, or may be integral with the housing 302. A face plate 306 is connected to a side of the housing 302 opposite the rear wall 304 spanning from first 303 to second 305 sidewalls thereof. Thus, combined, the housing 302, rear wall 304, and faceplate 306 define an interior chamber 308 in which a number of other components are disposed, as described below. A post 310 or other support strut may span the interior chamber 308 from the rear wall 304 to the faceplate 306 and may act as a guide for a screw or other fastener (not shown) to secure the faceplate 306 and rear wall 304 to the housing 302. In the depicted keeper 300, the post 310 separates the interior chamber 308 into a battery chamber 312 above and a deadbolt-receiver chamber 314 below, although the post 310 need not completely isolate the chambers 312, 314 from each other. The housing 302 also defines an elongate housing axis HA extending vertically through the interior chamber 308. The faceplate 306 defines a plurality of openings, specifically a battery opening 316 disposed proximate the battery chamber 312 and a deadbolt-receiver opening 318 disposed proximate the deadbolt-receiver chamber 314. A cover plate 320 or battery door may be disposed so as to cover the battery opening 316, while a decorative plate 322 defining an opening 324 may frame the deadbolt-receiver opening 318.

The configuration of the decorative plate 322 enables the keeper 300 to be utilized with the above-identified P3000 door lock. The opening 324 is, of course, aligned with the deadbolt-receiver opening 318. However, the decorative plate 322 also defines a latch opening 325 that allows for passage of the latch. This enables the door to be held shut without completely locking the door. Of course, decorative plates having different opening configurations may be utilized, depending on the type of lock utilized. As such, the keeper 300 may be utilized with the other locks, simply by changing the decorative plate size and/or configuration.

A circuit board 326 is disposed within the interior chamber 308. As above, the circuit board includes two sections or portions 328, 330. However, these are both secured to a second sidewall 205 of the housing 302. The first section 328 provides a mounting location for operational modules and components. For example, a battery holder 332 having a cradle 334 and cover 336 may be secured to the first portion 328. The second section 330 provides a mounting location for other operational modules and components, such as an RFID sensor 338 and a communication module 340. Both components may be located so as to be substantially parallel to a path of travel PT of a deadbolt as it enters the opening 324. A representative deadbolt 390 is depicted in FIGS. 3A and 3B. In 3B, notably, the position of the deadbolt 390 relative to the second section 330 is depicted. The RFID sensor 338 may be used to detect an RFID chip that may be installed in or on the deadbolt 390 when that deadbolt 390 is disposed in the interior chamber 308. Other types of sensors, such as proximity sensors, magnetic sensors, or mechanical sensors such as a pressure or contact sensor, may be utilized. Contact sensors may project into the path of travel PT.

The two sections or portions 328, 330 of the circuit board are communicatively coupled via a flexible ribbon 342 that may be formed as described above. In this depicted example of the electronic keeper 300, the first section 328 and second section 330 are both is disposed on a single side of the housing axis HA, but in the battery chamber 312 and in the deadbolt-receiving chamber 314, respectively.

Figure 3C:
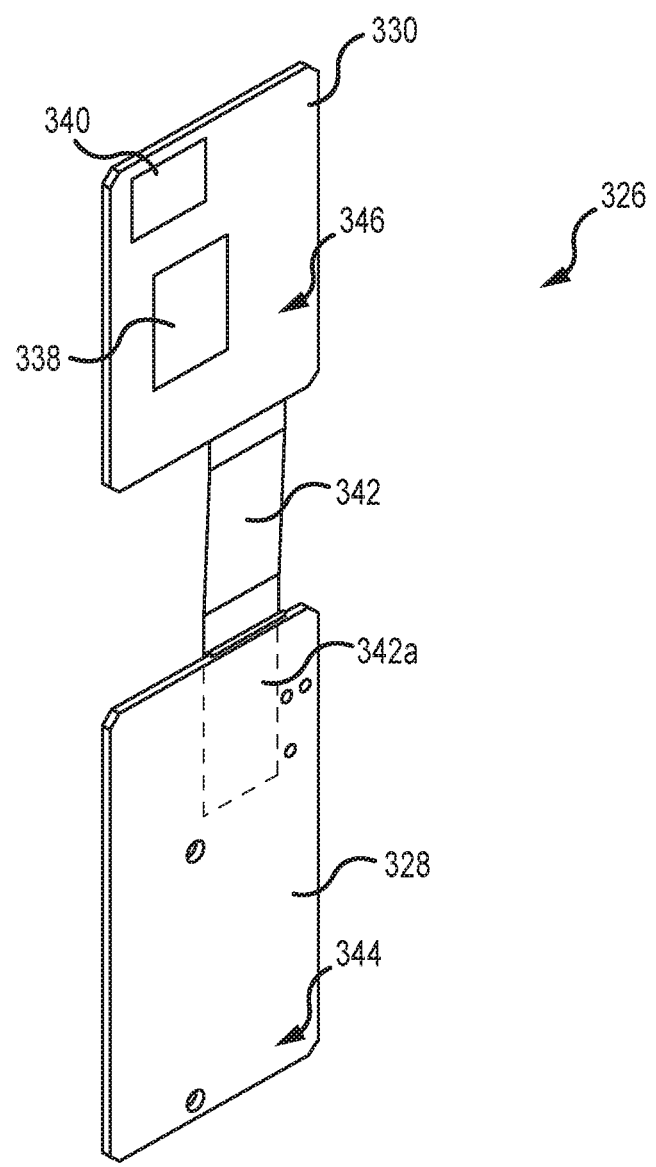
FIG. 3C is a perspective view of a circuit board for the electronic keeper of FIGS. 3A and 3B.

FIG. 3C is a perspective view of a circuit board for the electronic keeper of FIGS. 3A and 3B. The particular configuration allows the circuit board 326 to be used across a wide variety of keeper configurations, thereby reducing manufacturing costs and factory storage requirements for components prior to keeper manufacture. For example, the circuit board 326 is formed such that the modules, leads, and other components are disposed on a single side of the circuit board 326 when that circuit board 326 is in a flat configuration. That is, such components may be installed on a component face 344 of the first section 328 and a component face 346 of the second section 330. As such, when the flexible ribbon 342 is formed (e.g., folded or bent) into the configuration depicted in FIG. 3C, the component faces 344, 346 are facing towards the housing axis HA. A portion of 342a of the flexible ribbon 342 is folded behind the first section 328 so as to prevent damage thereto when installed. In another example, the flexible ribbon 342 may be folded into an L-shaped configuration such that the section 330a is positioned substantially orthogonal to the elongate axis HA, as described above.

Figure 4A:
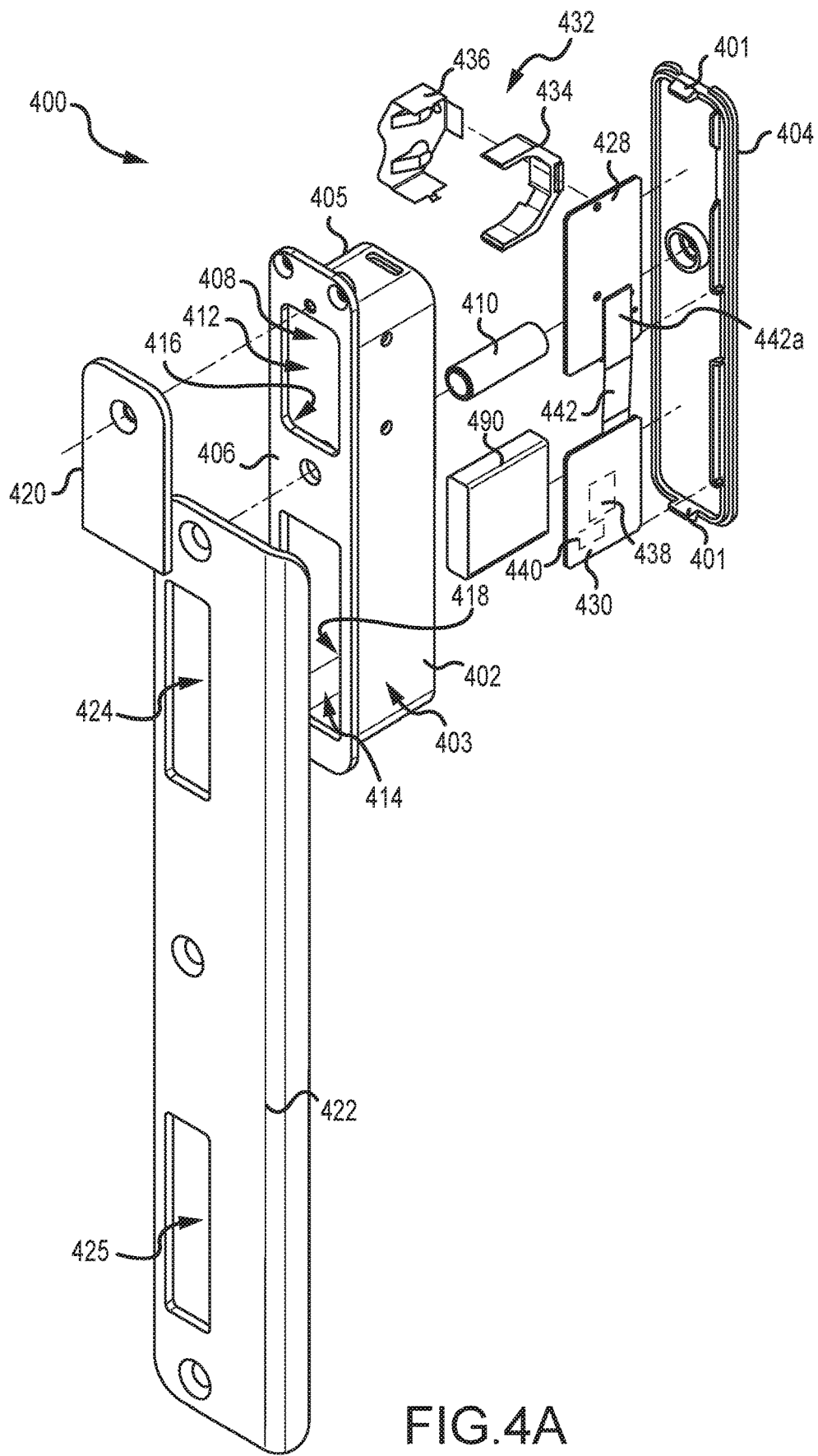
FIGS. 4A and 4B are exploded perspective and partial perspective views, respectively, of an electronic keeper in accordance with another example of the technology.
Figure 4B:
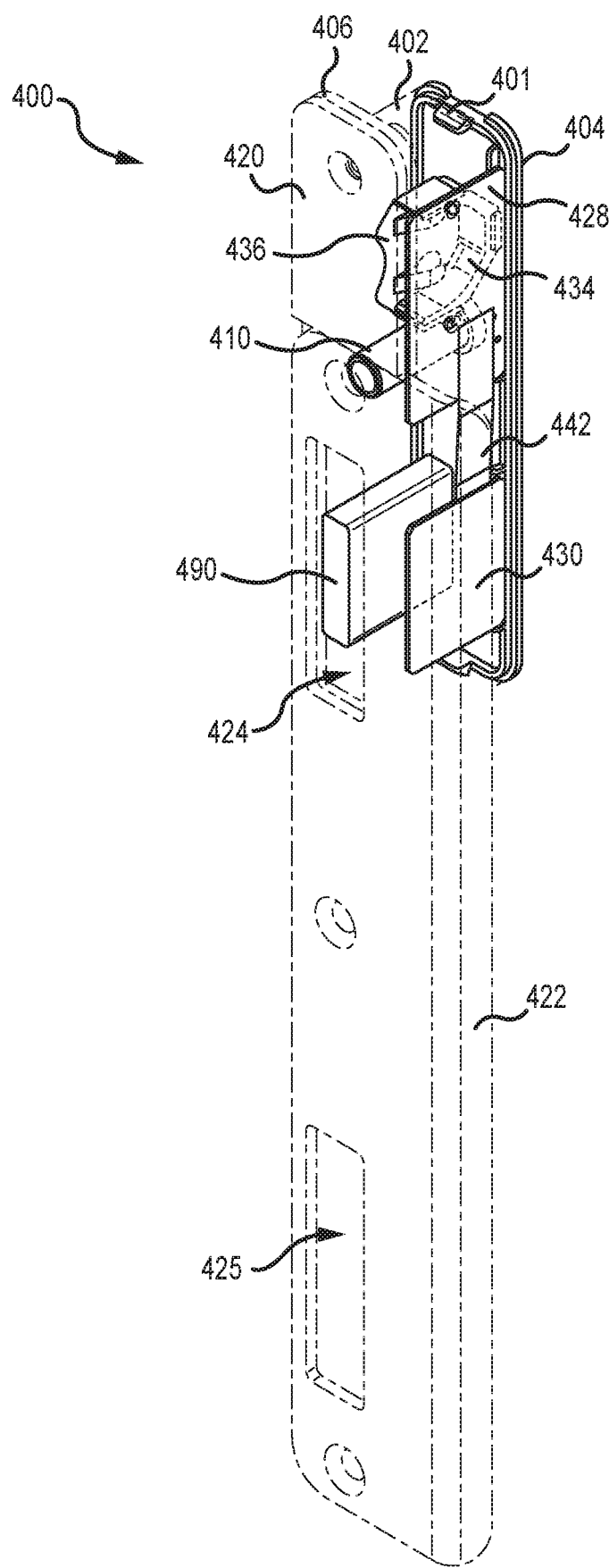

FIGS. 4A and 4B are exploded perspective and partial perspective views, respectively, of an electronic keeper 400 in accordance with another example of the technology. In FIG. 4B, an outer housing of the keeper is depicted in dashed lines so as to show the internal components thereof. This example of an electronic keeper 400 may be utilized with, for example, a swinging patio door and lock, such as the P2000 lock from Amesbury Truth. The P2000 includes a manually-operated deadbolt with a discrete spring-loaded latch. The keeper 400 includes a housing 402 and a rear wall 404 that may be snap-fit or press-fit onto the housing 402 with tabs 401. In another example, the rear wall 404 may be secured to the housing 402 with mechanical fasteners or adhesives, or may be integral with the housing 402. A face plate 406 is connected to a side of the housing 402 opposite the rear wall 404 spanning from first 403 to second 405 sidewalls thereof. Thus, combined, the housing 402, rear wall 404, and faceplate 406 define an interior chamber 408 in which a number of other components are disposed, as described below. A post 410 or other support strut may span the interior chamber 408 from the rear wall 404 to the faceplate 406 and may act as a guide for a screw or other fastener (not shown) to secure the faceplate 406 and rear wall 404 to the housing 402. In the depicted keeper 400, the post 410 separates the interior chamber 408 into a battery chamber 412 above and a deadbolt-receiver chamber 414 below, although the post 410 need not completely isolate the chambers 412, 414 from each other. The housing 402 also defines an elongate housing axis HA extending vertically through the interior chamber 408. The faceplate 406 defines a plurality of openings, specifically a battery opening 416 disposed proximate the battery chamber 412 and a deadbolt-receiver opening 418 disposed proximate the deadbolt-receiver chamber 414. A cover plate 420 or battery door may be disposed so as to cover the battery opening 416, while a decorative plate 422 defining an opening 424 may frame the deadbolt-receiver opening 418. As described above, altering a configuration of the decorative plate 422 allows this keeper 400 to be used with a variety of differently-configured locks, e.g., depending on location of the latch opening 425.

A circuit board 426 is disposed within the interior chamber 408. As above, the circuit board includes two sections or portions 428, 430 that are secured to a single sidewall 403 of the housing 402. The first section 428 provides a mounting location for operational modules and components. For example, a battery holder 432 having a cradle 434 and cover 436 may be secured to the first portion 428. The second section 430 provides a mounting location for other operational modules and components, such as, for example, an RFID sensor 438 and a communication module 440. Both components may be located so as to be substantially parallel to a path of travel PT of a deadbolt as it enters the opening 424. A representative deadbolt 490 is depicted in FIGS. 4A and 4B. In 4B, notably, the position of the deadbolt 490 relative to the second section 430 is depicted. The RFID sensor 438 may be used to detect an RFID chip on the deadbolt 490. Other types of sensors, such as proximity sensors, magnetic sensors, or mechanical sensors such as a pressure or contact sensor, may be utilized. Contact sensors may project into the path of travel PT.

The two sections or portions 428, 430 of the circuit board are communicatively coupled via a flexible ribbon 442 that may be formed as described above. In this depicted example of the electronic keeper 400, the first section 428 and second section 430 are disposed on a single side of the housing axis HA, and in the battery chamber but in different chambers 412, 414.

Figure 4C:
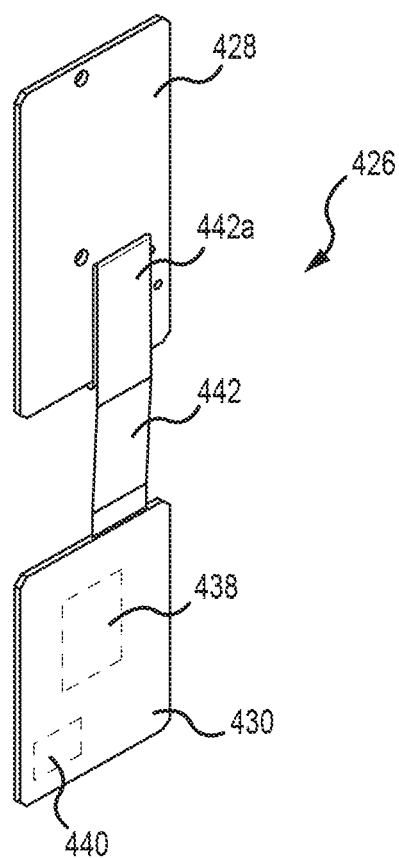
FIG. 4C is a perspective view of a circuit board for the electronic keeper of FIGS. 4A and 4B.

FIG. 4C is a perspective view of a circuit board for the electronic keeper of FIGS. 4A and 4B. The particular configuration allows the circuit board 426 to be used across a wide variety of keeper configurations, thereby reducing manufacturing costs and factory storage requirements for components prior to keeper manufacture. The ribbon 442 is folded as described above, such that a portion 442a is disposed behind the first portion 428.

FIG. 5 depicts a method 500 of manufacturing an electronic deadbolt system. FIGS. 5A-5F depict schematic side views of components of the electronic deadbolt system at various stages of manufacture. FIGS. 5-5F are described concurrently. The electronic deadbolt system may include components as described herein, such as a substantially cylindrical housing on elongate and a circuit board, etc. The housing may include a number of chambers defined by internal walls or other structures. The method 500 begins with providing an elongate circuit board 550, operation 502, depicted schematically in FIG. 5A. In operation 504, the circuit board 550 may be deformed or bent at a first location 1 as shown in FIG. 5B. This deformation can at least partially form the motor contact at the end of the ribbon, as described above in FIGS. 1A-1C. In another example, this first deformation need not be formed, if the motor contact is connected to, e.g., a bottom surface of a motor. A motor M and a deadbolt 552 (as well as the required or desired gears 554) are disposed proximate the circuit board 550 as shown in FIG. 5C, operation 506. In operations 508-512, the elongate circuit board 550 is deformed via folding or bending at second 2, third 3, and fourth 4 locations as depicted in FIG. 5D. The bending at the second 2 location is generally performed so as to provide clearance for the motor M, the deadbolt 552, and the gears 554. The bending at the second 2 and third 3 locations forms two parallel portions of the elongate circuit board 550. The elongate circuit board 550, motor M, deadbolt 552, and gears 554 are inserted I into a substantially cylindrical housing 556, e.g., via an open end, in operation 514. This is depicted in FIG. 5E. Once inserted, in operation 516, the motor M, deadbolt 552, and gears 554 are disposed generally in one chamber C1 of the housing 556, separated from another chamber C2 by the two parallel portions of the elongate circuit board 550. This is shown in FIG. 5F. Further, the motor M and deadbolt 552 may be further separated from each other into individual chambers by an internal structure or wall W.

Figure 6:
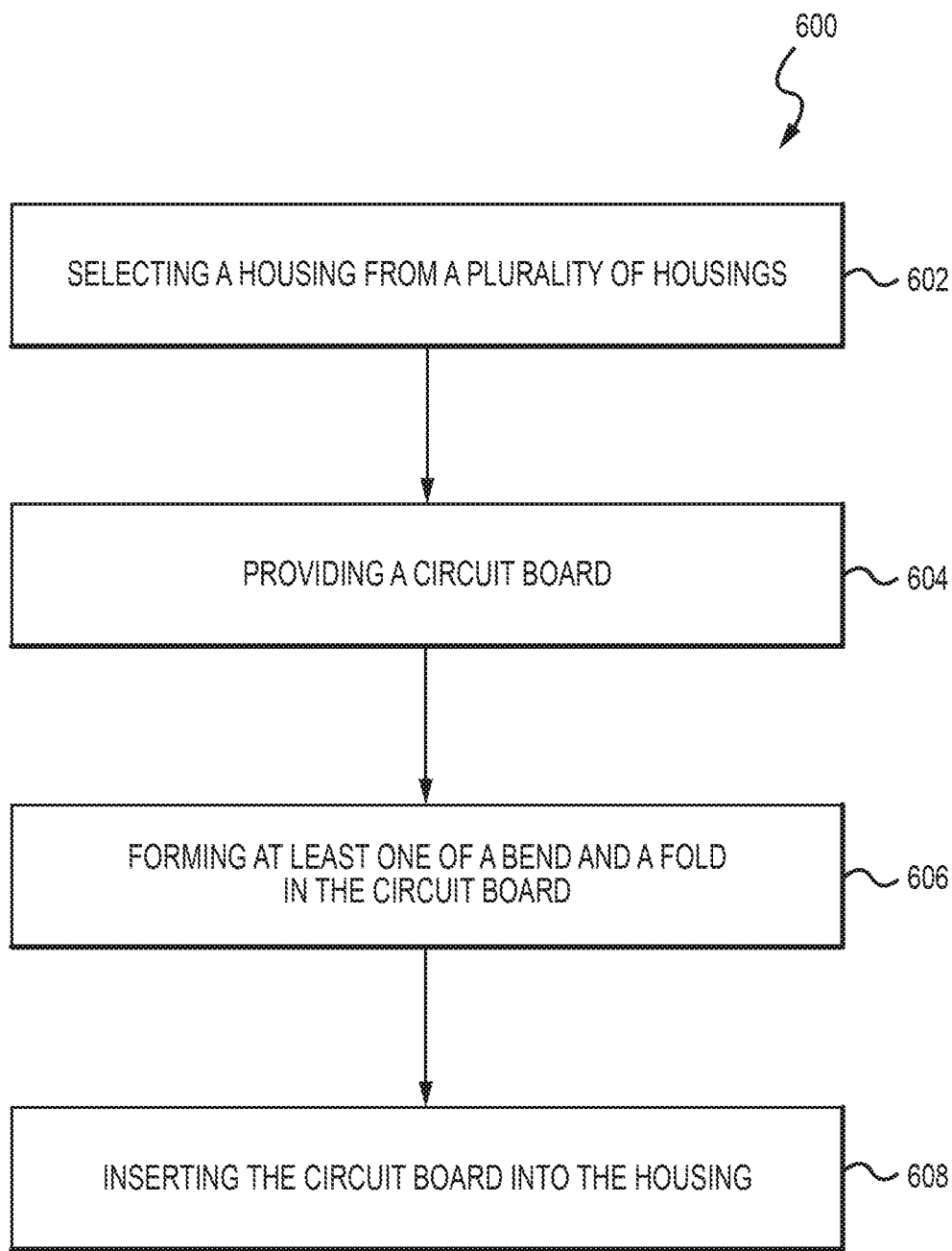
FIG. 6 depicts a method of manufacturing an electronic keeper.

FIG. 6 depicts a method 600 of manufacturing an electronic keeper. The keeper may be selected from any number of keeper housings having different lengths or configurations, as in operation 602. A circuit board is provided in operation 604. The circuit board may be the type depicted above; that is, the circuit board may have two portions connected by a flexible ribbon. Regardless of the housing selected, the length of the ribbon of the circuit board provided is the same. As described above, this enables a single circuit board configuration to be used across a wide range of keeper lengths and configurations. In operation 606, a bend or fold is formed in the circuit board, for example, in the ribbon thereof. Thereafter, the circuit board is inserted into the housing, operation 608, into discrete locations as required or desired for the particular housing.

Mechanical multi-point door lock systems are available in various configurations. Almost invariably, the mechanical multi-point lock systems include a main lock housing having more than one lock point extending therefrom, or a main lock housing connected via a linkage to one or more remote locking elements. Typically, in examples where a main lock housing has multiple lock points extending therefrom, the housing is often very bulky. In examples where a main lock housing is connected to remote locks via a linkage, the linkage must typically be installed in a so-called "Eurogroove" or elongate routed channel in an edge of the door. This linkage is then covered by a cover plate. Regardless of configuration, installation of a multi-point lock system is typically a complicated process, performed at a door manufacturing facility, or by a trained contractor. The electronic deadbolt and keeper systems described herein, however, can be positioned at various locations about a door panel so as to create a multi-point lock system, but without requiring complex installation procedures.

Figure 7:
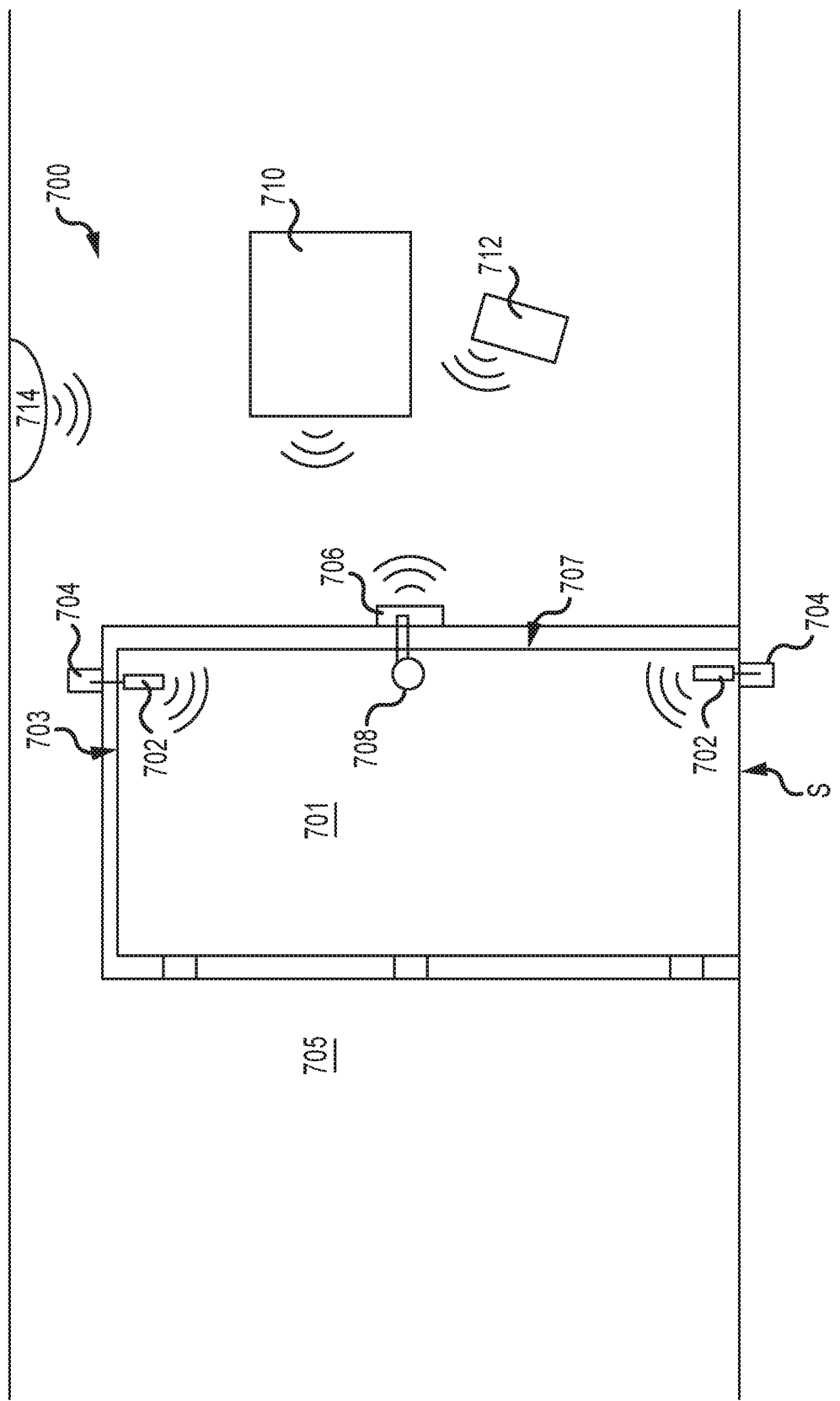
FIG. 7 depicts a schematic view of an electronic door lock system.

The electronic deadbolts and keepers described herein can be utilized in entry doors, sliding doors, pivoting patio doors, and other doors so as to create customized multi-point lock systems that are easy to install. FIG. 7 depicts a schematic view of one example of a multi-point electric door lock system 700 on a pivoting door. The system 700 includes two electronic deadbolt systems 702 installed in a door panel 701, for example, so as to extend into the head 703 and the sill S thereof. Alternatively, the electronic deadbolt 702 may be installed in the frame 705 so as to extend into the door 701. The placement and number of electronic deadbolt systems 702 may be altered as required or desired for a particular application. For example, in pivoting doors, the electronic deadbolts may be disposed so as to extend from the head 703, sill, S, or locking edge 707 of the door 701. In sliding patio doors, electronic deadbolts having linearly extending locking elements (as described herein) may extend from the head or sill of the sliding door. If utilized on the locking edge of a sliding door, the electronic deadbolt would require a hook-shaped locking element that would hook about a keeper so as to prevent retraction of the door. Each electronic deadbolt system 702 may be configured to as to extend into a keeper 704. Such keepers 704 may be standard keepers or the electronic keepers as described herein. The system 700 also includes an electronic keeper 706 configured to receive a standard (e.g., manually-actuated) deadbolt 708, as typically available on an entry or patio door.

In one configuration, once the deadbolt 708 is manually, the electronic keeper 706 detects a position of the deadbolt 708 therein. A signal may be sent to the remotely located electronic deadbolts 702, thus causing actuation thereof. At this point, the door 701 is now locked at multiple points. Unlocking of the manual deadbolt 708 is detected by the electronic keeper 706 (that is, the keeper 706 no longer detects the presence of the deadbolt 708 therein) and a signal is sent to the remote electronic deadbolts 702 causing retraction thereof, thus allowing the door to be opened. Thus, with minimal complexity, the electronic deadbolts and electronic keepers described herein may be utilized to create a robust multi-point locking system for a door, thus improving the security thereof.

In another example, the system 700 may include a controller/monitoring system, which may be a remote panel 710, which may be used to extend or retract the electronic deadbolts 702, or which may be used for communication between the various electronic keepers 704 and deadbolts 702. Alternatively or additionally, an application on a remote computer or smartphone 712 may take the place of, or supplement the remote panel 710. By utilizing a remote panel 710 and/or a smartphone 712, the electronic deadbolts 702 may be locked or unlocked remotely, thus providing multi-point locking ability without the requirement for manual actuation of a deadbolt. Additionally, any or all of the components (electronic deadbolt 702, keeper 706, panel 710, and smartphone 712) may communicate either directly or indirectly with a home monitoring or security system 714. The communication between components may be wireless, as depicted, or may be via wired systems.

The materials utilized in the manufacture of the lock and keepers described herein may be those typically utilized for lock manufacture, e.g., zinc, steel, aluminum, brass, stainless steel, etc. Molded plastics, such as PVC, polyethylene, etc., may be utilized for the various components. Material selection for most of the components may be based on the proposed use of the locking system. Appropriate materials may be selected for mounting systems used on particularly heavy panels, as well as on hinges subject to certain environmental conditions (e.g., moisture, corrosive atmospheres, etc.).

While there have been described herein what are to be considered exemplary and preferred examples of the present technology, other modifications of the technology will become apparent to those skilled in the art from the teachings herein. The particular methods of manufacture and geometries disclosed herein are exemplary in nature and are not to be considered limiting. It is therefore desired to be secured in the appended claims all such modifications as fall within the spirit and scope of the technology. Accordingly, what is desired to be secured by Letters Patent is the technology as defined and differentiated in the following claims, and all equivalents.

What is claimed is:

1. An apparatus comprising:
   a housing comprising an elongate axis and at least partially defining an interior chamber;
   a rear wall secured to the housing;
   a face plate secured to the housing, wherein the face plate defines a deadbolt opening;
   a post disposed within the interior chamber spanning between the rear wall and the face plate, wherein the post is configured to secure the face plate to the housing via a fastener, wherein the post separates the interior chamber into a battery chamber and a deadbolt-receiver chamber, wherein the battery chamber and the deadbolt-receiver chamber are at least partially open to one another, and wherein the deadbolt-receiver chamber is adjacent to the deadbolt opening such that an external deadbolt is receivable at least partially within the deadbolt-receiver chamber through entry of the external deadbolt into the deadbolt opening;
   a circuit board disposed within the interior chamber, wherein the circuit board comprises a first portion disposed at least partially within the battery chamber and a second portion disposed within the deadbolt-receiver chamber, wherein the first portion and the second portion are communicatively connected via a flexible ribbon;
   a battery holder connected to the first portion and disposed within the battery chamber; and
   a sensor connected to the second portion and disposed proximate the deadbolt opening within the deadbolt-receiver chamber, wherein the sensor is disposed substantially parallel to a path of travel of the external deadbolt as the external deadbolt enters the deadbolt opening.

2. The apparatus of claim 1, further comprising a battery door connected to at least one of the housing and the face plate, wherein the first portion is disposed proximate the battery door.

3. The apparatus of claim 1, wherein the first portion of the circuit board is disposed on a first side of the elongate axis and the second portion of the circuit board is disposed on a second side of the elongate axis, such that the flexible ribbon is formed into an approximate U-shaped configuration.

4. The apparatus of claim 1, wherein the first portion is disposed on a first side of the elongate axis and the second portion is disposed on the first side of the elongate axis, such that the flexible ribbon is formed into a folded configuration.

5. The apparatus of claim 1, wherein the sensor comprises at least one of an RFID sensor, a proximity sensor, a pressure sensor, and a magnet sensor.

6. The apparatus of claim 1, wherein the sensor comprises a mechanical sensor.

7. An apparatus comprising:
- a housing comprising a face plate and an opposite rear wall, wherein the housing, the face plate, and the rear wall at least partially define an interior chamber, wherein the face plate defines a first opening providing access to a first chamber of the interior chamber and a second opening providing access to a second chamber of the interior chamber, wherein the second opening and the second chamber are configured to selectively receive at least a portion of a bolt; and wherein the first chamber and the second chamber are at least partially open to one another;
- a support strut disposed within the interior chamber and at least partially separating the first chamber and the second chamber, wherein the support strut is configured to secure the face plate to the housing via a fastener;
- a first circuit board portion disposed in the first chamber of the housing proximate the first opening;
- a second circuit board portion disposed in the second chamber of the housing proximate the second opening, wherein receipt of the at least a portion of the bolt within the second chamber via the second opening is along a path of travel of the bolt, and wherein the second circuit board portion is disposed substantially parallel to the path of travel; and
- a flexible ribbon communicatively connecting the first circuit board portion and the second circuit board portion.

8. The apparatus of claim 7, wherein the housing comprises a first sidewall and a second sidewall, wherein the face plate spans from the first sidewall to the second sidewall.

9. The apparatus of claim 8, wherein the first circuit board portion is disposed proximate the first sidewall and the second circuit board portion is disposed proximate the second sidewall.

10. The apparatus of claim 8, wherein the first circuit board portion and the second circuit board portion are disposed proximate the first sidewall.

11. The apparatus of claim 7, further comprising:
- a battery holder secured to the first circuit board portion; and
- a sensor secured to the second circuit board portion.

12. The apparatus of claim 11, further comprising a battery door removably secured over the first opening.

13. The apparatus of claim 11, wherein the sensor comprises at least one of an RFID sensor, a proximity sensor, a pressure sensor, and a magnet sensor.

14. The apparatus of claim 7, further comprising a communication element secured to at least one of the first circuit board portion and the second circuit board portion.

* * * * *